United States Patent
Aoi

(10) Patent No.: US 6,936,552 B2
(45) Date of Patent: Aug. 30, 2005

(54) METHOD FOR SYNTHESIZING POLYMERIC MATERIAL, METHOD FOR FORMING POLYMER THIN FILM AND METHOD FOR FORMING INTERLAYER INSULATING FILM

(75) Inventor: Nobuo Aoi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 191 days.

(21) Appl. No.: 10/404,051

(22) Filed: Apr. 2, 2003

(65) Prior Publication Data

US 2004/0087182 A1 May 6, 2004

(30) Foreign Application Priority Data

Apr. 8, 2002 (JP) .......................................... 2002-105114

(51) Int. Cl.[7] .............................................. H01L 21/31
(52) U.S. Cl. ........................................ 438/781; 438/780
(58) Field of Search ................................ 438/780, 781, 438/149, 622

(56) References Cited

U.S. PATENT DOCUMENTS

| | | | |
|---|---|---|---|
| 3,852,239 A | | 12/1974 | Bellmann et al. |
| 5,536,573 A | * | 7/1996 | Rubner et al. ............... 428/378 |
| 6,060,333 A | * | 5/2000 | Tanaka et al. ................ 438/30 |
| 6,060,338 A | * | 5/2000 | Tanaka et al. ................ 438/99 |
| 6,271,273 B1 | * | 8/2001 | You et al. ..................... 521/61 |
| 6,602,804 B2 | * | 8/2003 | Allen et al. .................. 438/780 |
| 2005/0019576 A1 | | 1/2005 | Dahl et al. |

FOREIGN PATENT DOCUMENTS

| | | |
|---|---|---|
| JP | 49-052293 | 5/1974 |
| JP | 2399454 | 3/1979 |
| JP | 06-298934 | 10/1994 |
| JP | P2001-332543 A | 11/2001 |
| JP | 2002-093958 | 3/2002 |
| JP | 2003-012802 | 1/2003 |
| JP | 2004-617989 | 6/2004 |

* cited by examiner

Primary Examiner—Alexander Ghyka
(74) Attorney, Agent, or Firm—McDermott Will & Emery LLP

(57) ABSTRACT

A Lewis acid-base reaction is caused, in a solution, between a first monomer corresponding to a Lewis acid and a second monomer corresponding to a Lewis base, so as to generate a monomer adduct in which the first monomer and the second monomer are bonded to each other through weak electric interaction. Next, the solution including the monomer adduct is applied on a substrate so as to form a supramolecular solid thin film made of the monomer adduct. Then, the supramolecular solid thin film is heated so as to cause a polymerization reaction between the first monomer and the second monomer within the supramolecular solid thin film, thereby forming a polymer thin film.

8 Claims, 16 Drawing Sheets

FIG. 4
FIG. 4(a)
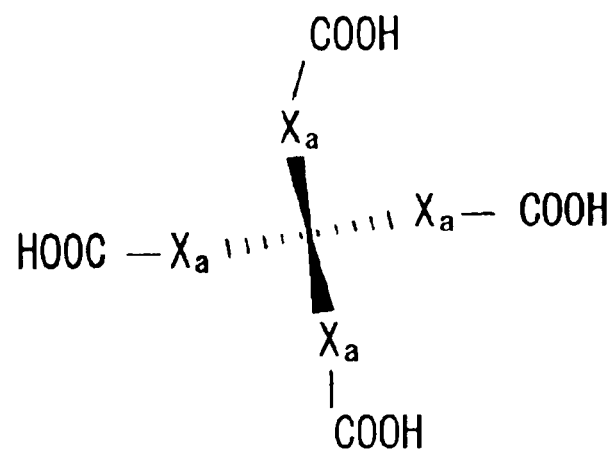
FIG. 4(b)
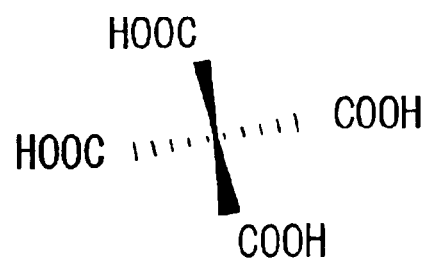

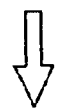

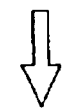

METHOD FOR SYNTHESIZING POLYMERIC MATERIAL, METHOD FOR FORMING POLYMER THIN FILM AND METHOD FOR FORMING INTERLAYER INSULATING FILM

TECHNICAL FIELD

The present invention relates to methods for forming a polymeric material, a polymer thin film and an interlayer insulating film with a low dielectric constant and high mechanical strength.

BACKGROUND ART

As an organic polymer film conventionally used as an interlayer insulating film for a VLSI, an organic polymer film formed through polymerization of molecules including an aromatic group for increasing heat resistance, such as an organic polymer film made of a polyimide derivative, a polyallyl ether derivative, a polyquinoline derivative or a polyparaxylene derivative, is known. Since such an organic polymer film includes carbon as a principal constituent, the polarizability of constituent molecules is small and hence the dielectric constant is low as compared with that of a conventional interlayer insulating film including $SiO_2$ as a principal constituent. Therefore, such an organic polymer film is regarded as an interlayer insulating film with a low dielectric constant. The dielectric constant of an organic polymer film including carbon as a principal constituent is approximately 2.4 through 3.0, which is lower than the dielectric constant of a general interlayer insulating film including $SiO_2$ as a principal constituent, that is, approximately 3.3 through 4.5. However, some of the interlayer insulating films including $SiO_2$ as a principal constituent, such as an organic SOG including an organic constituent, are known to have a dielectric constant of approximately 2.9.

The conventional organic polymer film attains a low dielectric constant because the polarizability of organic molecules is smaller than that of $SiO_2$, and in order to further lower the dielectric constant, examination is being made on porosity of an organic polymer film.

When an organic polymer film is made porous, however, although the dielectric constant can be largely lowered, the adhesion and the mechanical strength are lowered on the other hand. This is because of a principle defect that the lowering of the dielectric constant resulting from the porosity is realized through lowering of the crosslink density of the organic polymer film. Since the mechanical strength of an organic polymer film is higher as the crosslink density is higher, the lowering of the crosslink density resulting from the porosity lowers the hardness of the organic polymer film as well as its glass transition temperature.

The lowering of the adhesion and the mechanical strength of an interlayer insulating film can disadvantageously cause destruction of the interconnect structure in chemical mechanical polishing (CMP) performed for planarizing the interlayer insulating film. Also, when the glass transition temperature is lowered, the interlayer insulating film is softened in annealing subsequently carried out on the interlayer insulating film, and hence, the multilayer interconnect structure can be disadvantageously deformed or destroyed.

In order to realize a low dielectric constant of an organic polymer film without lowering the adhesion and the mechanical strength, Japanese Laid-Open Patent Publication No. 2001-332543 proposes a low dielectric organic polymer film with a three-dimensional polymer structure in which three-dimensional pores are formed in an organic polymer. In a method described in this publication, a polymer structure including three-dimensional pores with a size of a molecular level is formed by, for example, forming a copolymer of a three-dimensional crosslinked molecule having four functional groups and a straight chain molecule (two-dimensional crosslinked molecule) having two functional groups that form a chemical bond with the functional groups of the three-dimensional molecule or by polymerizing molecules having pores among them.

In this method, a pore with a size of a molecular level can be formed in an organic polymer film, and therefore, improvement of heat resistance (improvement of the glass transition temperature) derived from the increased crosslink density and improvement of the mechanical strength can be attained at the same time as a low dielectric constant.

An organic polymer film with a high crosslink density, however, has a high level three-dimensional network, and hence is likely to gel. A gel is a wet solid in which a large amount of solvent is insolubilized in the network as a result of crosslinkage proceeded as a polymerization reaction proceeds.

Therefore, it is very difficult to form a mold or adjust a raw material suitable to a thin film from a gel wet solid and it is impossible to apply a gel wet solid on a substrate.

Accordingly, it is very difficult to form an organic polymer film that includes pores with a size of a molecular level and has a high crosslink density.

DISCLOSURE OF THE INVENTION

In consideration of the aforementioned conventional disadvantages, an object of the invention is definitely forming an organic polymer film that includes pores with a size of a molecular level and has a high crosslink density.

In order to achieve the object, the first method for synthesizing a polymeric material includes the steps of forming a supramolecular structure by allowing a Lewis acid and a Lewis base in a solution state to self-organize through acid-base interaction; and generating a polymer three-dimensional structure by polymerizing the Lewis acid and the Lewis base included in the supramolecular structure with the supramolecular structure used as a polymerization reaction environment.

In the first method for synthesizing a polymeric material of this invention, since pores with a molecular size are distributed within a polymer, the size of the pores can be made uniform and the pores can be uniformly dispersed. Since a network for forming the polymer is not broken, the crosslink density can be increased.

In the first method for synthesizing a polymeric material of the invention, the polymer three-dimensional structure is preferably a thin film including a large number of fine pores arranged at high regularity therein.

Thus, the dielectric constant of the thin film made from the polymer can be definitely lowered, and since a network for forming the thin film of the polymer is not cut, the crosslink density can be increased so as to improve the mechanical strength of the thin film.

The second method for synthesizing a polymeric material of this invention includes the steps of generating a monomer adduct in which a first monomer corresponding to a Lewis acid and a second monomer corresponding to a Lewis base are bonded to each other through weak electric interaction by causing a Lewis acid-base reaction between the first monomer and the second monomer in a solution; generating a supramolecular solid made of the monomer adduct by evaporating a solvent from the solution including the monomer adduct; and generating a polymer solid by causing a polymerization reaction between the first monomer and the second monomer within the supramolecular solid.

In the second method for synthesizing a polymeric material of this invention, since pores with a molecular size are distributed within the supramolecular solid, the size of the pores can be made uniform and the pores can be uniformly dispersed, and therefore, the dielectric constant of the supramolecular solid can be definitely lowered. Also, since a network for forming the supramolecular solid is not broken, the crosslink density can be increased so as to improve the mechanical strength.

In the second method for synthesizing a polymeric material of this invention, the Lewis acid is preferably a carboxylic acid derivative, an alcohol derivative, a ketone derivative, an aldehyde derivative or an acid anhydride derivative, and the Lewis base is preferably an amine derivative.

Thus, the Lewis acid-base reaction can definitely proceed in the solution between the first monomer corresponding to the Lewis acid and the second monomer corresponding to the Lewis base, and hence, the monomer adduct can be definitely generated in the solution.

In the second method for synthesizing a polymeric material of this invention, the Lewis acid is preferably an adamantane derivative having a carboxyl group, and the Lewis base is preferably a tetraaminobenzidine derivative having an amino group, a tetraaminobenzene derivative having an amino group or a diaminodihydroxylbenzene derivative having an amino group.

Thus, the Lewis acid-base reaction can further definitely proceed in the solution between the first monomer corresponding to the Lewis acid and the second monomer corresponding to the Lewis base, and hence, the monomer adduct can be further definitely generated in the solution.

In this case, the adamantane derivative having a carboxyl group is preferably a 1-carboxyladamantane derivative, a 1,3-dicarboxyladamantane derivative, a 1,3,5-tricarboxyladamantane derivative, a 1,3,5,7-tetracarboxyladamantane derivative or a mixture of any of the derivatives.

Thus, a polymeric material with flexibility and a cushioning property can be synthesized.

In the second method for synthesizing a polymeric material of this invention, the Lewis acid is preferably a benzene derivative having a carboxyl group, a benzidine derivative having a carboxyl group, a naphthalene derivative having a carboxyl group, an anthracene derivative having a carboxyl group or a tetracene derivative having a carboxyl group, and the Lewis base is preferably an adamantane derivative having an amino group.

Thus, the Lewis acid-base reaction can further definitely proceed in the solution between the first monomer corresponding to the Lewis acid and the second monomer corresponding to the Lewis base, and hence, the monomer adduct can be further definitely generated in the solution.

In this case, the adamantane derivative having an amino group is preferably a 1-aminoadamantane derivative, a 1,3-diaminoadamantane derivative, a 1,3,5-triaminoadamantane derivative, a 1,3,5,7-tetraamine derivative or a mixture of any of the derivatives.

Thus, a polymeric material with flexibility and a cushioning property can be synthesized.

In the second method for synthesizing a polymeric material of this invention, at least one of the first monomer and the first monomer preferably has a flexible bond.

In this case, the flexible bond can be formed by a methylene group.

The method for forming a polymer thin film of this invention includes the steps of generating a monomer adduct in which a first monomer corresponding to a Lewis acid and a second monomer corresponding to a Lewis base are bonded to each other through weak electric interaction by causing a Lewis acid-base reaction between the first monomer and the second monomer in a solution; forming a supramolecular solid thin film made of the monomer adduct by applying the solution including the monomer adduct on a substrate; and forming a polymer thin film by causing a polymerization reaction between the first monomer and the second monomer within the supramolecular solid thin film by heating the supramolecular solid thin film.

In the method for forming a polymer thin film of this invention, since pores with a molecular size are distributed within the polymer thin film, the size of the pores can be made uniform and the pores can be uniformly dispersed, and therefore, the dielectric constant of the polymer film can be definitely lowered. Also since a network for forming the polymer thin film is not broken, the crosslink density can be increased so as to improve the mechanical strength. Furthermore, the supramolecular solid thin film made of the monomer adduct is first formed by applying, on the substrate, the solution including the monomer adduct in which the first monomer corresponding to the Lewis acid and the second monomer corresponding to the Lewis base are bonded to each other through the weak electric interaction, and then, the first monomer and the second monomer are polymerized. Therefore, the thickness of the film can be easily reduced as compared with the case where a wet solid that is in a gel state because polymerization has started is applied on a substrate.

In the method for forming a polymer thin film of this invention, the Lewis acid is preferably a carboxylic acid derivative, an alcohol derivative, a ketone derivative, an aldehyde derivative or an acid anhydride derivative, and the Lewis base is preferably an amine derivative.

Thus, the Lewis acid-base reaction can be definitely caused in the solution between the first monomer corresponding to the Lewis acid and the second monomer corresponding to the Lewis base, and hence, the monomer adduct can be definitely generated in the solution.

In the method for forming a polymer thin film of this invention, the Lewis acid is preferably an adamantane derivative having a carboxyl group, and the Lewis base is preferably a tetraaminobenzidine derivative having an amino group, a tetraaminobenzene derivative having an amino group or a diaminodihydroxylbenzene derivative having an amino group.

Thus, the Lewis acid-base reaction can be further definitely caused in the solution between the first monomer corresponding to the Lewis acid and the second monomer corresponding to the Lewis base, and hence, the monomer adduct can be further definitely generated in the solution.

In this case, the adamantane derivative having a carboxyl group is preferably a 1-carboxyladamantane derivative, a 1,3-dicarboxyladamantane derivative, a 1,3,5-tricarboxyladamantane derivative, a 1,3,5,7-tetracarboxyladamantane derivative or a mixture of any of the derivatives.

Thus, a polymer thin film with flexibility and a cushioning property can be formed.

In the method for forming a polymer thin film of this invention, the Lewis acid is preferably a benzene derivative having a carboxyl group, a benzidine derivative having a carboxyl group, a naphthalene derivative having a carboxyl group, an anthracene derivative having a carboxyl group or a tetracene derivative having a carboxyl group, and the Lewis base is preferably an adamantane derivative having an amino group.

Thus, the Lewis acid-base reaction can be further definitely caused in the solution between the first monomer corresponding to the Lewis acid and the second monomer corresponding to the Lewis base, and hence, the monomer adduct can be further definitely generated in the solution.

In this case, the adamantane derivative having an amino group is preferably a 1-aminoadamantane derivative, a 1,3-diaminoadamantane derivative, a 1,3,5-triaminoadamantane derivative, a 1,3,5,7-tetraamine derivative or a mixture of any of the derivatives.

Thus, a polymer thin film with flexibility and a cushioning property can be formed.

In the method for forming a polymer thin film of this invention, at least one of the first monomer and the first monomer preferably has a flexible bond.

In this case, the flexible bond can be formed by a methylene group.

The method for forming an interlayer insulating film of this invention includes the steps of generating a monomer adduct in which a first monomer corresponding to a Lewis acid and a second monomer corresponding to a Lewis base are bonded to each other through weak electric interaction by causing a Lewis acid-base reaction between the first monomer and the second monomer in a solution; forming a supramolecular solid thin film made of the monomer adduct by applying the solution including the monomer adduct on a substrate; and forming an interlayer insulating film by causing a polymerization reaction between the first monomer and the second monomer within the supramolecular solid thin film by heating the supramolecular solid thin film.

In the method for forming an interlayer insulating film of this invention, since pores with a molecular size are distributed within the interlayer insulating film, the size of the pores can be made uniform and the pores can be uniformly dispersed, and therefore, the dielectric constant of the interlayer insulating film can be definitely lowered. Also since a network for forming the interlayer insulating film is not broken, the crosslink density can be increased so as to improve the mechanical strength. Furthermore, the supramolecular solid thin film made of the monomer adduct is first formed by applying, on the substrate, the solution including the monomer adduct in which the first monomer corresponding to the Lewis acid and the second monomer corresponding to the Lewis base are bonded to each other through the weak electric interaction, and then, the first monomer and the second monomer are polymerized. Therefore, the thickness of the interlayer insulating film can be easily reduced as compared with the case where a wet solid that is in a gel state because polymerization has started is applied on a substrate.

In the method for forming an interlayer insulating film of this invention, the Lewis acid is preferably a carboxylic acid derivative, an alcohol derivative, a ketone derivative, an aldehyde derivative or an acid anhydride derivative, and the Lewis base is preferably an amine derivative.

Thus, the Lewis acid-base reaction can be definitely caused in the solution between the first monomer corresponding to the Lewis acid and the second monomer corresponding to the Lewis base, and hence, the monomer adduct can be definitely generated in the solution.

In the method for forming an interlayer insulating film of this invention, the Lewis acid is preferably an adamantane derivative having a carboxyl group, and the Lewis base is preferably a tetraaminobenzidine derivative having an amino group, a tetraaminobenzene derivative having an amino group or a diaminodihydroxylbenzene derivative having an amino group.

Thus, the Lewis acid-base reaction can be further definitely caused in the solution between the first monomer corresponding to the Lewis acid and the second monomer corresponding to the Lewis base, and hence, the monomer adduct can be further definitely generated in the solution.

In this case, the adamantane derivative having a carboxyl group is preferably a 1-carboxyladamantane derivative, a 1,3-dicarboxyladamantane derivative, a 1,3,5-tricarboxyladamantane derivative, a 1,3,5,7-tetracarboxyladamantane derivative or a mixture of any of the derivatives.

Thus, an interlayer insulating film with flexibility and a cushioning property can be formed.

In the method for forming an interlayer insulating film of this invention, the Lewis acid is preferably a benzene derivative having a carboxyl group, a benzidine derivative having a carboxyl group, a naphthalene derivative having a carboxyl group, an anthracene derivative having a carboxyl group or a tetracene derivative having a carboxyl group, and the Lewis base is preferably an adamantane derivative having an amino group.

Thus, the Lewis acid-base reaction can be further definitely caused in the solution between the first monomer corresponding to the Lewis acid and the second monomer corresponding to the Lewis base, and hence, the monomer adduct can be further definitely generated in the solution.

In this case, the adamantane derivative having an amino group is preferably a 1-aminoadamantane derivative, a 1,3-diaminoadamantane derivative, a 1,3,5-triaminoadamantane derivative, a 1,3,5,7-tetraamine derivative or a mixture of any of the derivatives.

Thus, an interlayer insulating film with flexibility and a cushioning property can be formed.

In the method for forming an interlayer insulating film of this invention, at least one of the first monomer and the first monomer preferably has a flexible bond.

In this case, the flexible bond can be formed by a methylene group.

BRIEF DESCRIPTION OF DRAWINGS

FIGS. 4(a) and 4(b) are diagrams of exemplified chemical formulas of the first monomer corresponding to a Lewis acid.

BEST MODE FOR CARRYING OUT THE INVENTION

A method for synthesizing a polymeric material, a method for forming a polymer thin film and a method for forming an interlayer insulating film according to one embodiment of the invention will now be described with reference to FIGS. 1(a), 1(b) and 2.

Figure 1A:
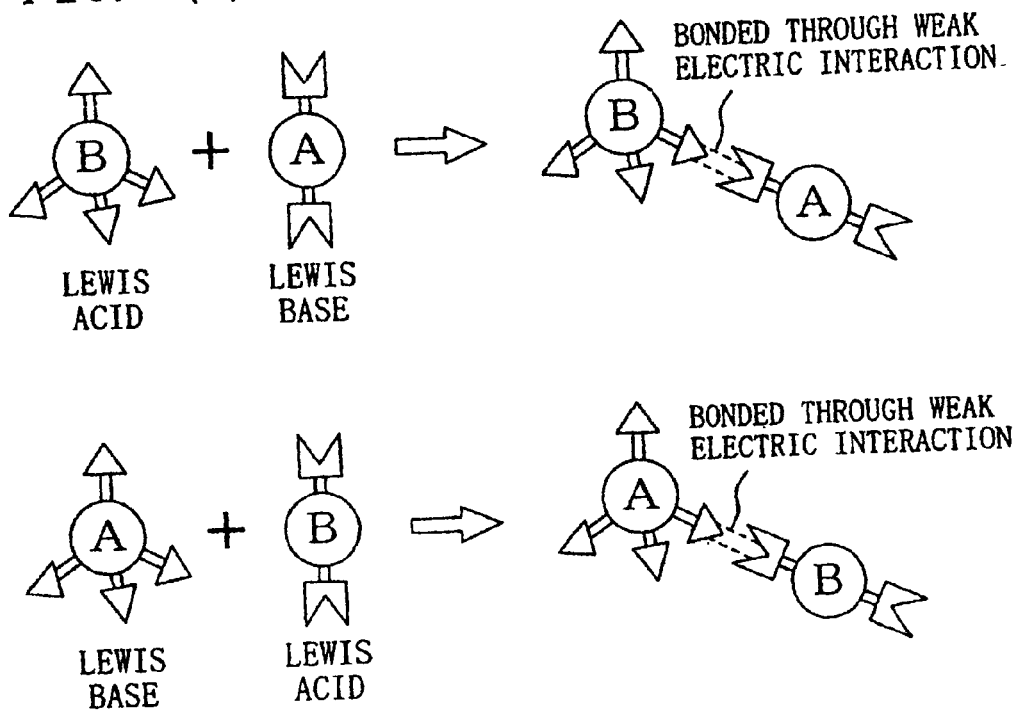
FIG. 1(a) is a conceptual diagram of a bond through weak electric interaction between a Lewis acid and a Lewis base and FIG. 1(b) is a schematic diagram of a monomer adduct made of a Lewis acid and a Lewis base.

First, as shown in FIG. 1(a), a Lewis acid-base reaction is caused in a solution between a first monomer B corresponding to a Lewis acid and a second monomer A corresponding to a Lewis base. In this manner, since the Lewis acid and the Lewis base are bonded to each other through weak electric interaction, a monomer adduct as shown in FIG. 1(b) is generated. In FIG. 1(b), a portion where the first monomer B corresponding to the Lewis acid and the second monomer A corresponding to the Lewis base are bonded to each other through the weak electric interaction is shown with a white circle.

At this point, the Lewis acid-base reaction will be described. The Lewis acid-base reaction, which was presented by Lewis in 1923, is a reaction on the basis of a theory regarding a reaction between an acid and a base through donation/acceptance of electrons. According to this theory, a substance that donates an electron pair so as to form a chemical bond is a base and a substance that accepts an electron pair so as to form a chemical bond is an acid. Accordingly, a base is defined as an electron pair donor and an acid is defined as an electron pair acceptor. Also, a reaction between an acid and a base is explained as donation/ acceptance of an electron pair and the resultant reconstitution of a bond. Accordingly, all the electron donation/ acceptance reaction herein defined are included in the Lewis acid-base reaction. Also, a system including no hydrogen ions, and in particular, a system that forms a coordinate bond are also defined as the acid-base reaction according to the theory of Lewis.

Figure 1B:
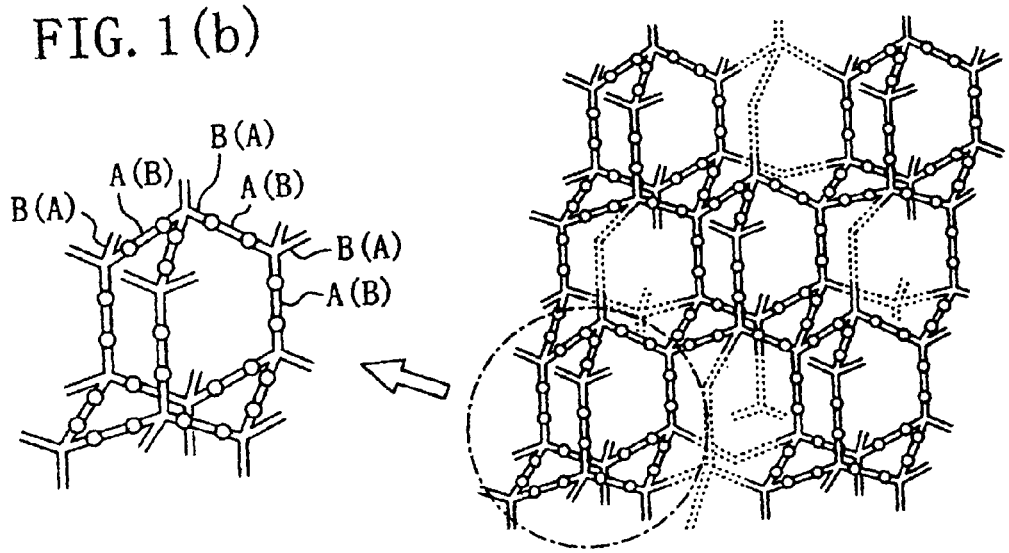

Next, a solvent is evaporated from the solution including the monomer adduct shown in FIG. 1(b). Thus, a supramolecular solid made of the monomer adduct is formed.

In this case, when the solvent is evaporated from the solution including the monomer adduct after applying the solution on a substrate, a supramolecular solid thin film is formed on the substrate.

Alternatively, when the solvent is evaporated from the solution including the monomer adduct after applying the solution on a substrate on which a semiconductor device or an interconnect structure has been formed, a supramolecular solid thin film is formed on the semiconductor device or the interconnect structure.

Figure 2:
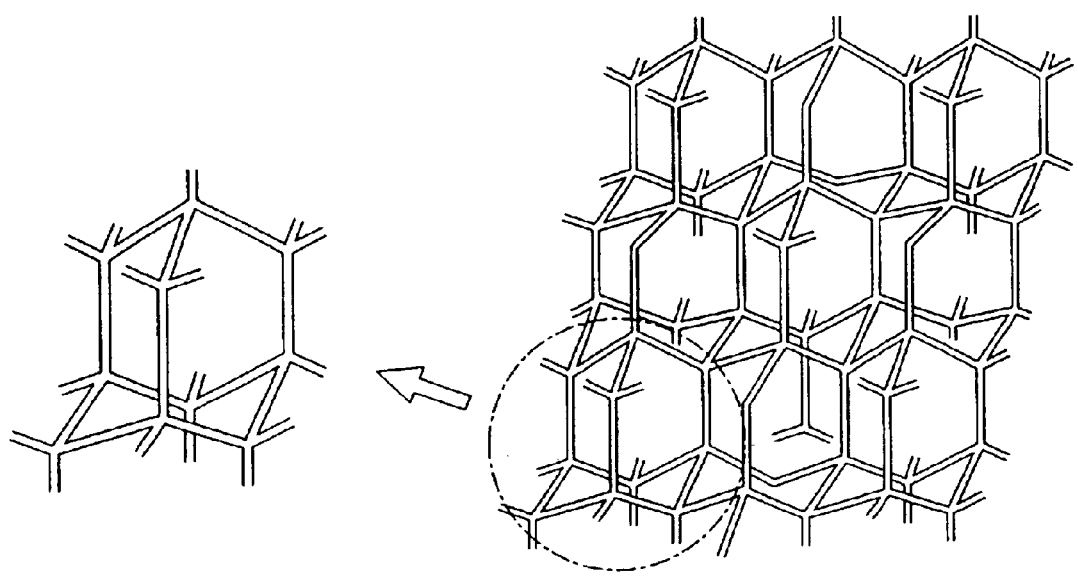
FIG. 2 is a schematic diagram of a polymer solid obtained through polymerization of a first monomer corresponding to a Lewis acid and a second monomer corresponding to a Lewis base.

Next, a polymerization reaction is caused in the supramolecular solid between the first monomer B and the second monomer A, thereby forming a polymer solid as shown in FIG. 2.

In this case, when the polymerization reaction is caused between the first monomer B and the second monomer A within a supramolecular solid thin film, a polymer thin film is obtained.

Alternatively, when the polymerization reaction is caused between the first monomer B and the second monomer A within a supramolecular solid thin film formed on a semiconductor device or an interconnect structure, an interlayer insulating film is obtained.

In a conventional method for forming an organic porous film, pores are formed in the film by cutting bonds between molecules included in the film. Therefore, there arise problems that the mechanical strength is lowered and that the film quality is not uniform and is degraded. In other words, since the bonds between the molecules are broken, a network that plays an important role in securing the mechanical strength of the film is partially broken, which lowers the mechanical strength of the film. Also, since statistical variation is caused in the size of pores (namely, size distribution is caused) and the pores are ununiformly dispersed, there arises a principle problem that the film quality is ununiform. In addition, there is a possibility that a pore with a size approximate to the design rule is formed, and hence, there arises a problem that a pattern defect can be caused. Furthermore, since pores are continuous, moisture, an etching gas or a cleaning solution may be diffused in the film during processing, which causes a problem that the film quality can be degraded. Accordingly, the conventional organic porous film cannot cope with refinement of LSIs.

In contrast, according to this embodiment, since pores with a molecular size are distributed within the polymer, the size of the pores are uniform and the pores are uniformly dispersed. As a result, the dielectric constant can be definitely lowered.

Also, since the network for forming the polymer is not broken, the crosslink density is high so as to improve the mechanical strength.

Furthermore, the supramolecular solid thin film made of the monomer adduct is first formed by applying, on the substrate, the solution including the monomer adduct in which the first monomer corresponding to the Lewis acid and the second monomer corresponding to the Lewis base are bonded to each other through the weak electric interaction, and then, the first monomer and the second monomer are polymerized. Therefore, a thin film can be easily formed as compared with the case where a wet solid that is in a gel state because polymerization has started is applied on a substrate.

Now, the Lewis acid and the Lewis base usable in an embodiment of the invention will be described.

First, as the first monomer corresponding to the Lewis acid, a carboxylic acid derivative, an alcohol derivative, a ketone derivative, an aldehyde derivative or an acid anhydride derivative can be used. Examples of these derivatives are exemplified in FIGS. 3(*a*), 3(*b*), 4(*a*) and 4(*b*). In FIGS. 3(*a*) and 3(*b*), $X_a$ is aromatic hydrocarbon, aliphatic hydrocarbon or a derivative of aromatic hydrocarbon.

In the case where the first monomer is a carboxylic acid derivative, an alcohol derivative, a ketone derivative, an aldehyde derivative or an acid anhydride derivative, the second monomer corresponding to the Lewis base is preferably an amine derivative. Examples of the amine derivative are exemplified in FIGS. 7(*a*) through 7(*d*) and 8(*a*) through 8(*d*). In FIGS. 7(*a*) through 7(*d*) and 8(*a*) through 8(*d*), at least one of $X_5$ and $X_6$ is a $NH_2$ group, and when $X_5$ or $X_6$ is not a $NH_2$ group, it is a OH group. At least one of $X_7$ and $X_8$ is a $NH_2$ group, and when $X_7$ or $X_8$ is not a $NH_2$ group, it is a OH group.

In the case where the first monomer is an adamantane derivative having a carboxyl group, the second monomer is particularly preferably a tetraaminobenzidine derivative having an amino group, a tetraaminobenzene derivative having an amino group or a diaminodihydroxylbenzene derivative having an amino group. Examples of the adamantane derivative having a carboxyl group are a 1-carboxyladamantane derivative, a 1,3-dicarboxyladamantane derivative, a 1,3,5-tricarboxyladamantane derivative, a 1,3,5,7-tetracarboxyladamantane derivative and a mixture of any of these derivatives.

According to another embodiment of the invention, as the first monomer corresponding to the Lewis acid, a benzene derivative having a carboxyl group, a benzidine derivative having a carboxyl group, a naphthalene derivative having a carboxyl group, an anthracene derivative having a carboxyl group or a tetracene derivative having a carboxyl group can be used. Examples of these derivatives are exemplified in FIGS. 5(*a*) through 5(*d*) and 6(*a*) through 6(*d*). In FIGS. 5(*a*) through 5(*d*) and 6(*a*) through 6(*d*), $X_1$ and $X_2$ together form a base represented by Chemical Formula 1 or Chemical Formula 2, and $X_3$ and $X_4$ together form the base represented by Chemical Formula 1 or Chemical Formula 2.

Chemical Formula 1:

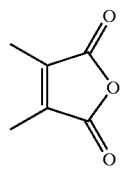

Chemical Formula 2:

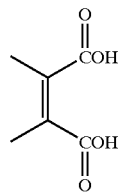

In the case where the first monomer is a benzene derivative, a benzidine derivative, a naphthalene derivative, an anthracene derivative or a tetracene derivative having a carboxyl group, the second monomer corresponding to the Lewis base is preferably an adamantane derivative having an amino group. Examples of the adamantane derivative having an amino group are a 1-aminoadamantane derivative, a 1,3-diaminoadamantane derivative, a 1,3,5-triaminoadamantane derivative and a 1,3,5,7-tetraamine derivative. Examples of the adamantane derivative having an amino group are exemplified in FIGS. 9(*a*), 9(*b*), 10(*a*) and 10(*b*). In FIGS. 9(*a*) and 10(*a*), $X_b$ is aromatic hydrocarbon, aliphatic hydrocarbon or a derivative of aromatic hydrocarbon.

Figure 11:
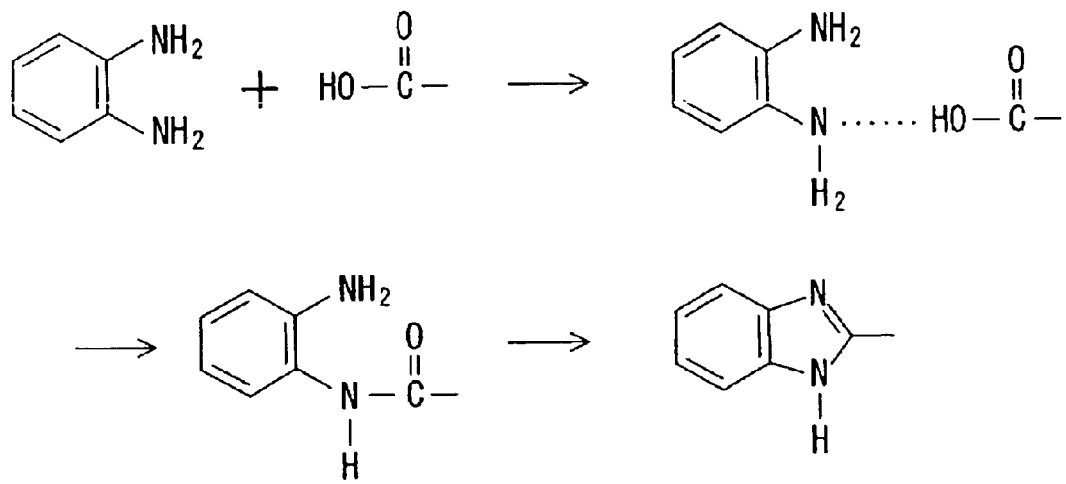
FIG. 11 is a chemical reaction formula representing generation of a polyimidazole-based polymer.

FIG. 11 shows a chemical reaction occurring in generating a polyimidazole-based polymer from a first monomer having a carboxyl group and a second monomer having two amino groups.

Figure 12:
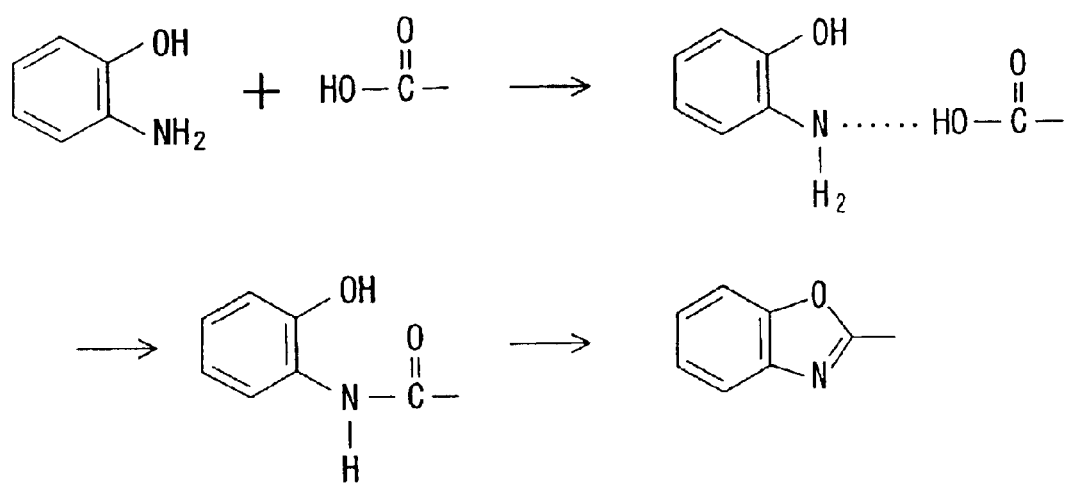
FIG. 12 is a chemical reaction formula representing generation of a polyoxazole-based polymer.

FIG. 12 shows a chemical reaction occurring in generating a polyoxazole-based polymer from a first monomer having a carboxyl group and a second monomer having an amino group and a hydroxyl group.

Figure 13:
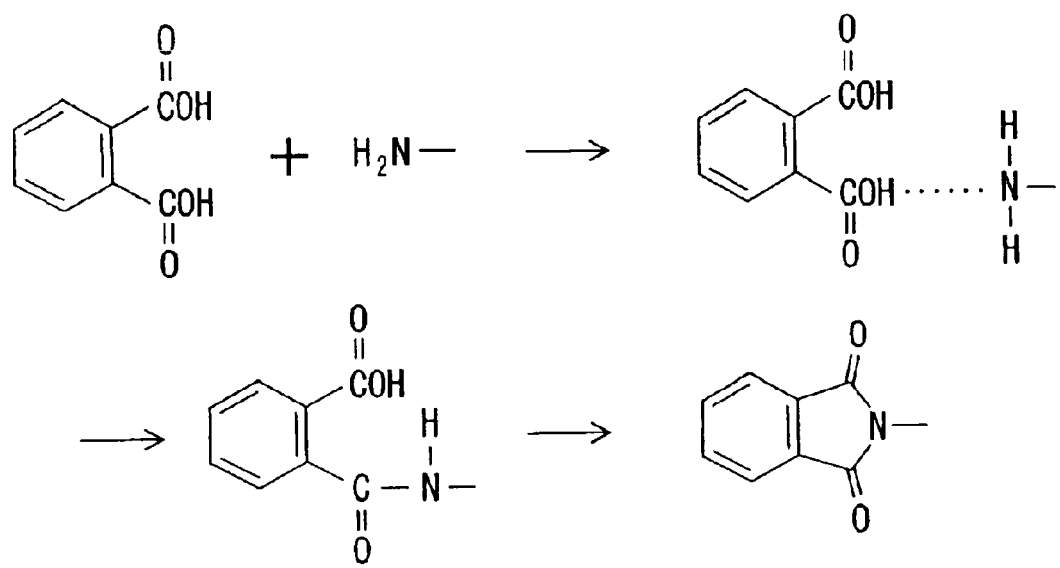
FIG. 13 is a chemical reaction formula representing generation of a polyimide-based polymer.

FIG. 13 shows a chemical reaction occurring in generating a polyimide-based polymer from a first monomer having an amino group and a second monomer having two carboxyl groups.

EXAMPLE

An example for embodying one embodiment of the invention will be described with reference to FIGS. 14(*a*) through 14(*d*) and 15.

In this example, as the first monomer corresponding to the Lewis acid, two-dimensional crosslinked molecules having two groups of functional groups, such as a tetraaminobenzidine derivative, is used. Also, as the second monomer corresponding to the Lewis base, three-dimensional crosslinked molecules having four groups of functional groups, such as a tetracarboxyladamantane derivative that is an adamantane derivative having four carboxyl groups, is used.

Herein, a group of functional groups means a portion that includes one or more functional groups and can be used for bonding molecules to each other regardless of the chemical number of functional groups. For example, two carboxyl groups (functional groups) bond to one amino group (functional group), thereby forming one imide ring, and since the two carboxyl groups and the one amino group together have one bonding site, the two carboxyl groups and the one amino group respectively correspond to the groups of functional groups.

Figure 14A:
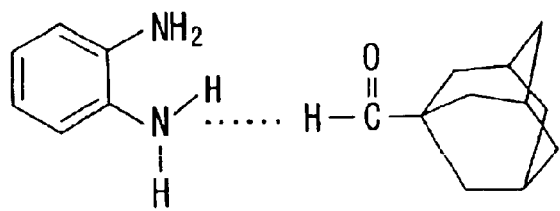
FIGS. 14(a) through 14(d) are chemical formulas explaining an example of the invention.
Figure 15:
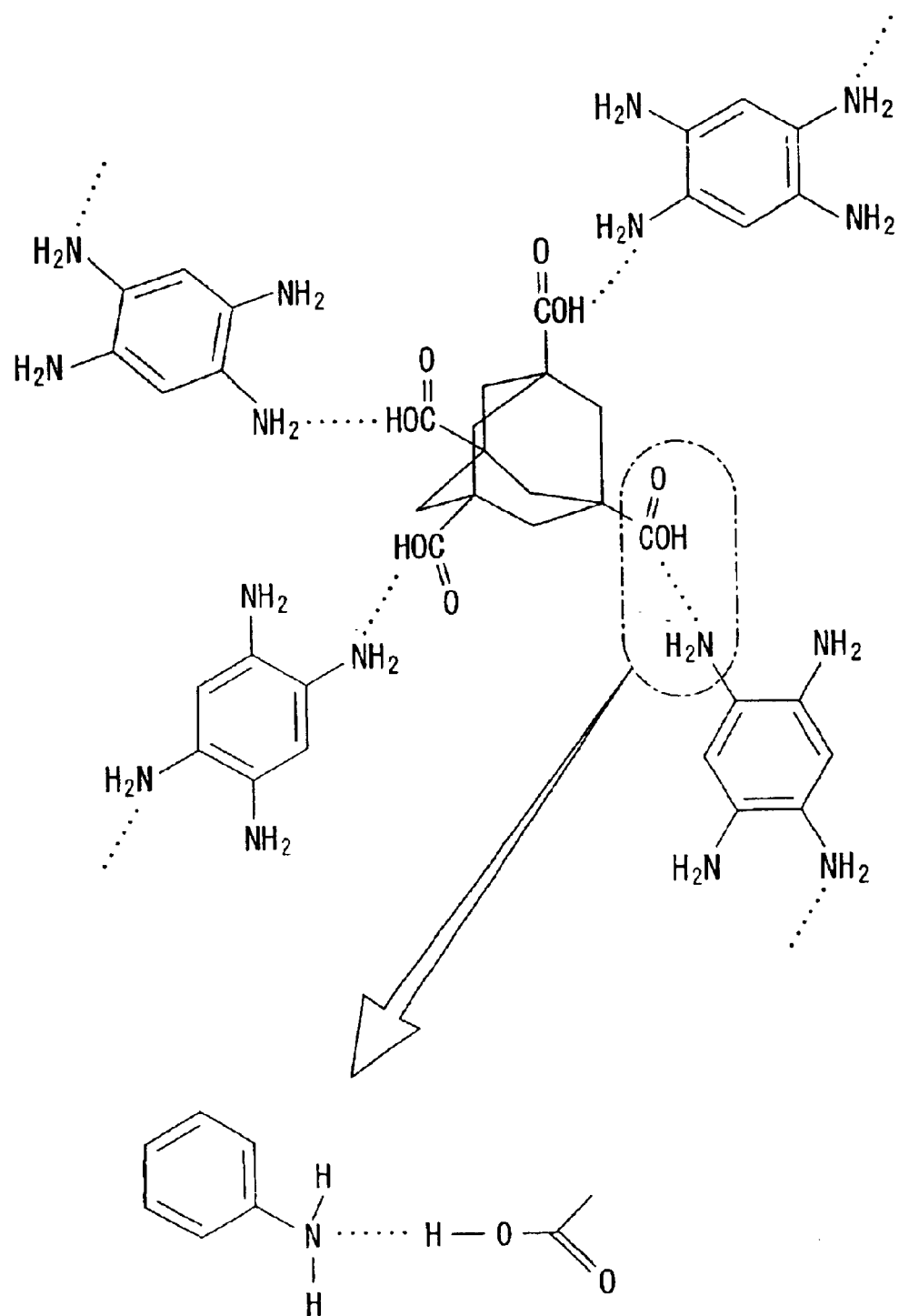
FIG. 15 is a schematic diagram of a monomer adduct obtained in the example of the invention.

In a solution including cyclohexanone, the tetracarboxyladamantane derivative (the second monomer) and the tetraaminobenzidine derivative (the first monomer) are mixed to give a mixed solution. Thus, the tetracarboxyladamantane derivative and the tetraaminobenzidine derivative are bonded to each other through the weak electric interaction in the mixed solution, and therefore, a monomer adduct shown in FIGS. 14(a) and 15 is obtained.

Although the tetraaminobenzidine derivative is difficult to singly dissolve in cyclohexanone, it is dissolved in cyclohexanone while gradually forming the Lewis acid-base adduct because it coexists with the tetracarboxyladamantane derivative in this example. In this case, the concentration of a solid content of the mixed solution is adjusted to 10% and the molar ratio between the tetraaminobenzidine derivative and the tetracarboxyladamantane derivative is adjusted to 2:1. This is a stoichiometric mixture ratio necessary for forming a film with a desired thickness and for generating a monomer adduct having a structure approximate to the diamond structure in the mixed solution.

Figure 14B:
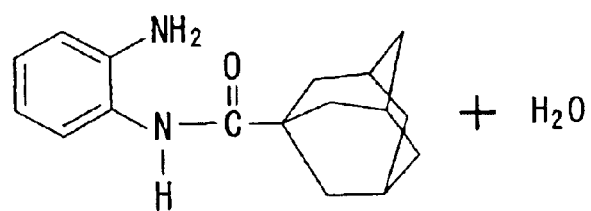

Next, the mixed solution including the monomer adduct is stirred for approximately 30 minutes at a temperature of approximately 60° C., and then, the resultant mixed solution is filtrated with a Teflon filter of 0.2 μm. Thereafter, 5 ml of the resultant mixed solution is applied on a semiconductor substrate rotated at a speed of 4000 rpm, thereby forming a coat film. Next, the semiconductor substrate is heated with a hot plate at 250° C., thereby drying the coat film, namely, evaporating the solvent from the coat film. In this manner, a supramolecular solid (or a supramolecular solid thin film) as shown in FIG. 14(b) is obtained.

Figure 14C:
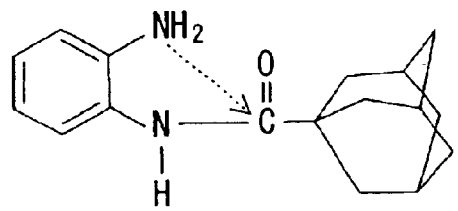
Figure 14D:
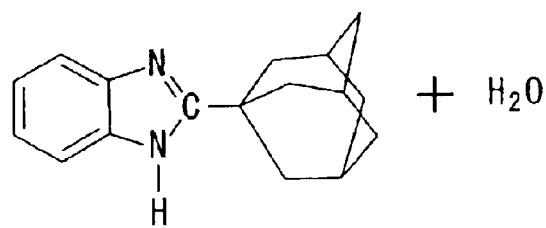

Then, in a nitrogen atmosphere, the semiconductor substrate is heated for 20 minutes at a temperature of 300° C., and then for 30 minutes at a temperature of 400° C., thereby baking the supramolecular solid (or the supramolecular solid thin film). In this manner, a polymerization reaction as shown in FIG. 14(c) occurs, so as to give a polymer solid (or a polymer thin film) as shown in FIG. 14(d).

In this example, the tetracarboxyladamantane derivative (the second monomer) that is a Lewis acid having functional groups on the respective vertices of a tetrahedron, namely, having four functional groups, and the tetraaminobenzidine derivative (the first monomer) that is a Lewis base having functional groups at the respective ends of a straight line, namely, two functional groups, are bonded to each other through the weak electric interaction, resulting in forming the Lewis acid-base adduct having the diamond structure.

Next, when the solution including the Lewis acid-base adduct is applied on the substrate so as to form the thin film, the Lewis acid-base adduct keeps its diamond structure within the thin film.

Then, when the thin film is heated, the Lewis acid and the Lewis base are polymerized within the Lewis acid-base adduct, resulting in forming the polymer film having the diamond structure.

The three-dimensional network polymer film obtained in this example had a thickness of 400 nm. When the capacity value of the polymer film was measured by a CV method using a mercury prober and the dielectric coefficient of the polymer film was calculated on the basis of the film thickness and the capacity value, the dielectric coefficient was found to be 1.5. Although the dielectric coefficient of the polymer film is varied depending upon the mixing ratio of the adamantane derivative and the benzene derivative, the dielectric coefficient of a resultant polymer film was minimized when the adamantane derivative and the benzene derivative were mixed at a molar ratio of approximately 1:2.

Figure 16:
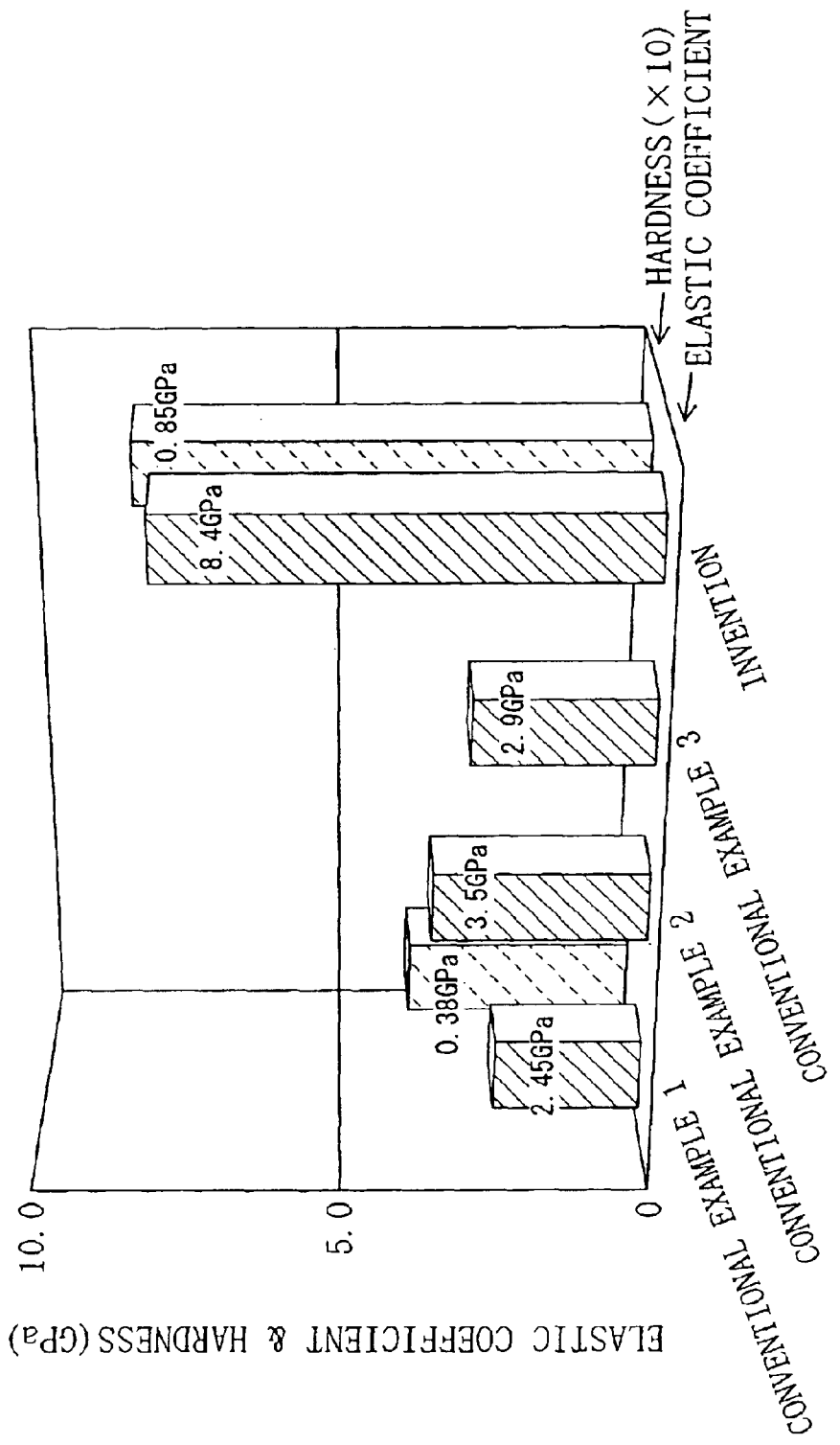
FIG. 16 is a diagram for showing comparison between a polymer film of the example and polymer films of conventional examples.
Figure 17:
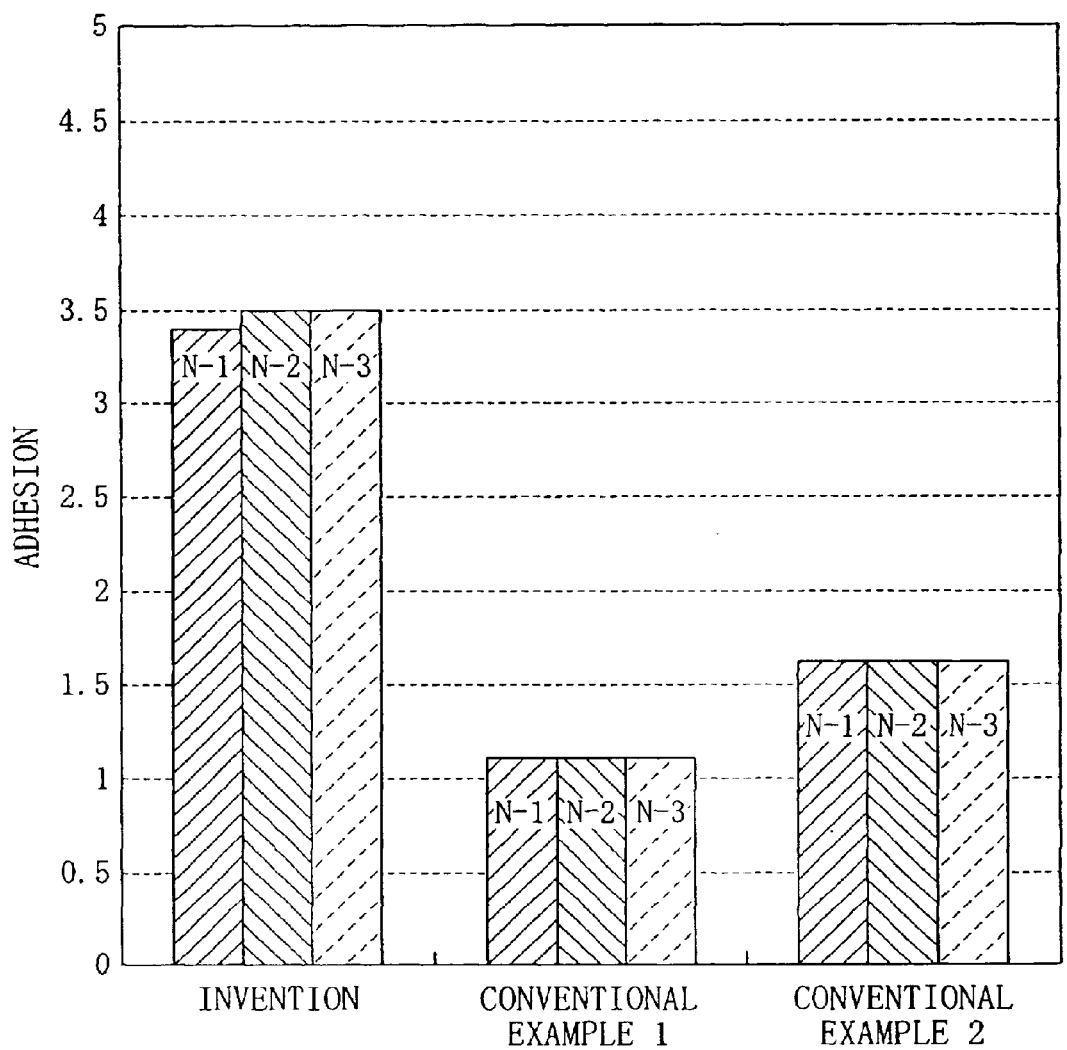
FIG. 17 is a diagram for showing comparison between the polymer film of the example and polymer films of conventional examples.

The elastic modulus and the hardness of the polymer film obtained in this example are listed in Table 1, and comparison (comparison in the elastic coefficient, the hardness and the adhesion) between the polymer film of this example and polymer films of conventional examples are shown in FIGS. 16 and 17.

TABLE 1

| Polyimidazole | Hardness (GPa) | Er (GPa) |
|---|---|---|
| 20-00 | 0.86 | 8.5 |
| 20-01 | 0.85 | 8.3 |
| 20-03 | 0.83 | 8.4 |
| Average | 0.85 | 8.4 |

As shown in FIG. 16, the elastic coefficient and the hardness of the polymer film of this invention are twice or three times as high as those of the polymer films of the conventional examples, and thus, the mechanical strength of the film is improved. The polymer film of Conventional Example 1 is a SiLK film (brand name; a polyphenylene-based polymer film), the polymer film of Conventional Example 2 is a BCB film (brand name; a benzocyclobutene-based polymer film) formed by a plasma method, and the polymer film of Conventional Example 3 is a BCB film formed by a coating method.

Also, as shown in FIG. 17, the adhesion is also twice or three times as high as those of the conventional examples, and thus, the adhesion of the film is improved. The polymer films of Conventional Example 1 and Conventional Example 2 are polyimide-based polymer films.

Although an imide-forming reaction through the reaction between a carboxyl group and an amino group is employed in this example, the reaction system is not limited to this but any of reaction systems such as an amide bond, an ether bond, a C—C bond and a C—N bond can be used.

Also, in an organic film whose crosslink density is increased to improve the elastic coefficient and the hardness, the internal stress is too large to cause strain, which disadvantageously results in a crack of the film or a warp of the substrate. In order to overcome this disadvantage, a method for introducing a flexible monomer or partially introducing a less crosslinked monomer is effective. When such a method is employed, the lowering of the mechanical strength of the film itself can be suppressed and the stress of the film can be reduced.

Figure 3A:
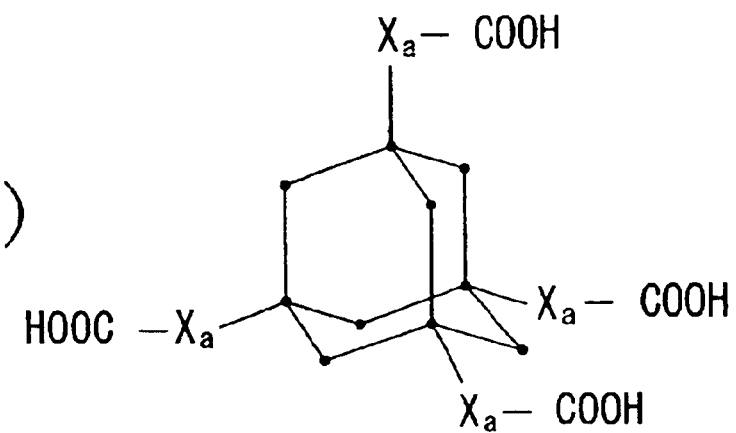
FIGS. 3(a) and 3(b) are diagrams of exemplified chemical formulas of the first monomer corresponding to a Lewis acid.
Figure 3B:
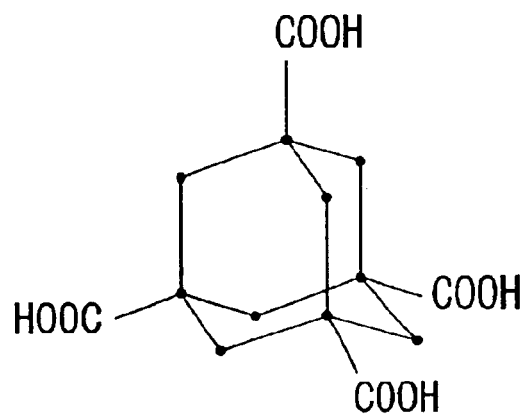
Figure 5A:
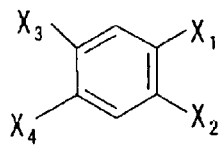
FIGS. 5(a) through 5(d) are diagrams of exemplified chemical formulas of the first monomer corresponding to a Lewis acid.
Figure 5B:
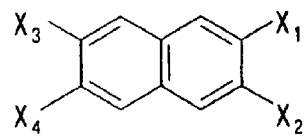
Figure 5B:
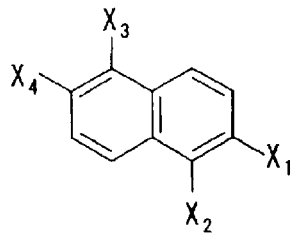
Figure 5C:
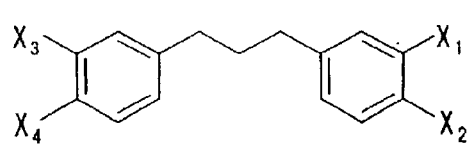
Figure 5C:
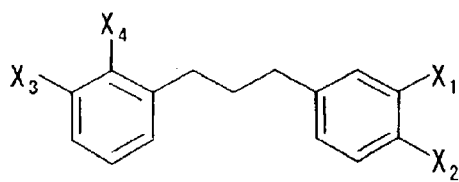
Figure 5C:
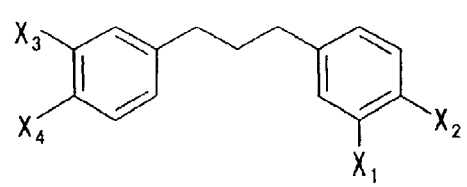
Figure 5C:
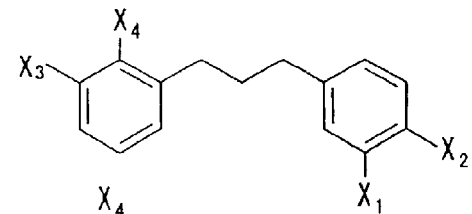
Figure 5C:
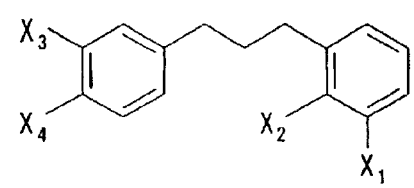
Figure 5C:
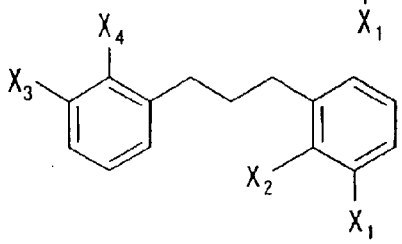
Figure 5D:
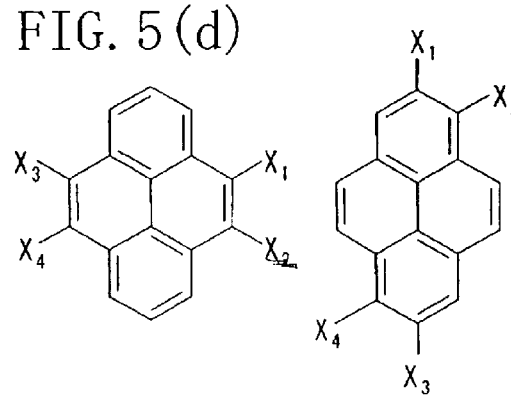
Figure 5D:
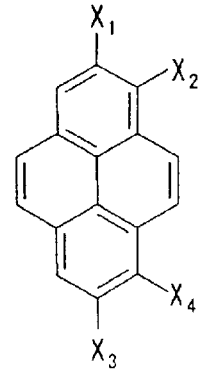
Figure 5D:
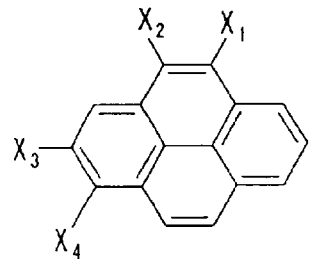
Figure 6A:
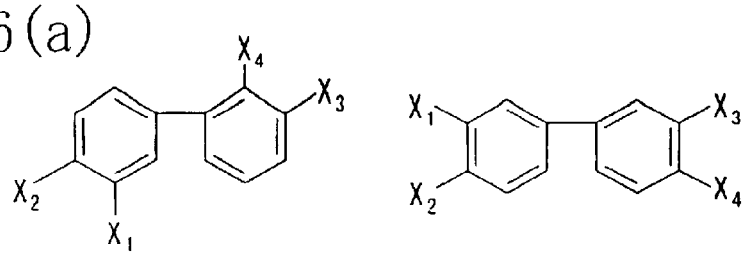
FIGS. 6(a) through 6(d) are diagrams of exemplified chemical formulas of the first monomer corresponding to a Lewis acid.
Figure 6B:
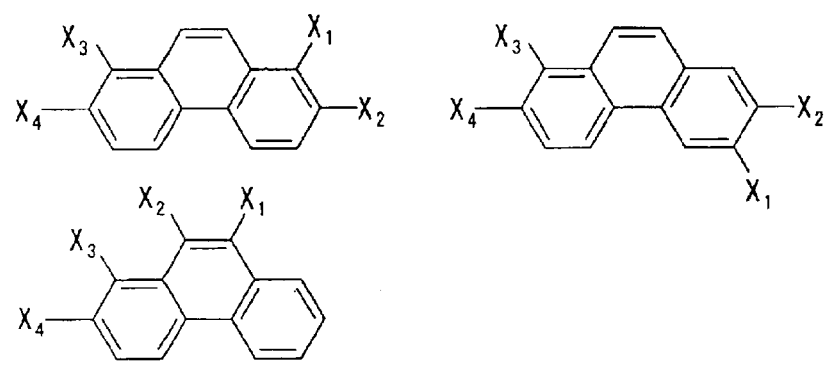
Figure 6C:
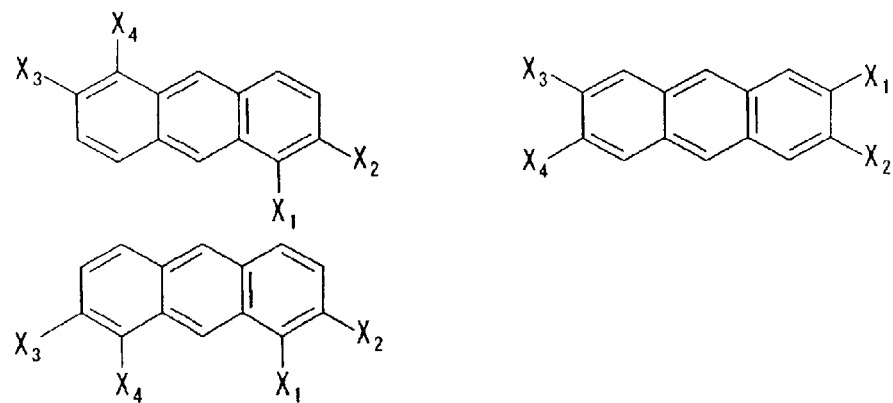
Figure 6D:
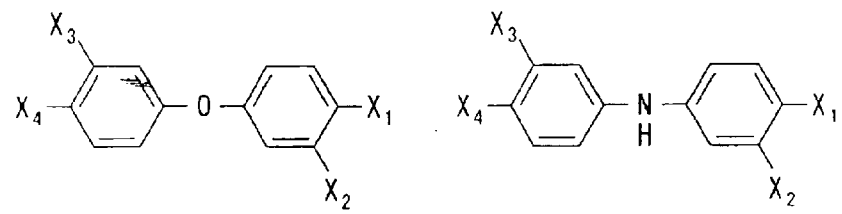
Figure 7A:
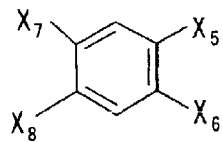
FIGS. 7(a) through 7(d) are diagrams of exemplified chemical formulas of the second monomer corresponding to a Lewis base.
Figure 7B:
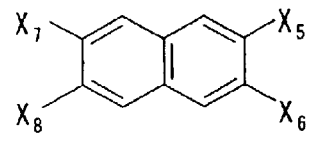
Figure 7B:
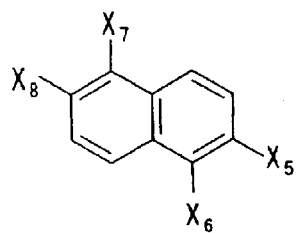
Figure 7C:
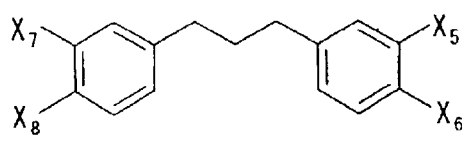
Figure 7C:
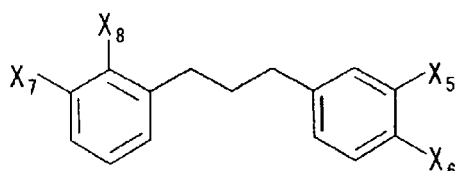
Figure 7C:
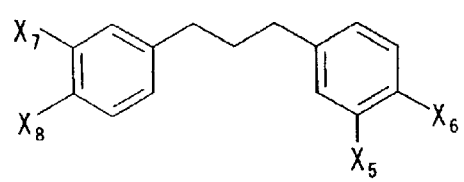
Figure 7C:
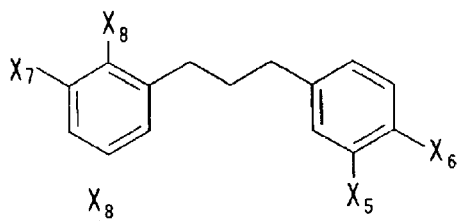
Figure 7C:
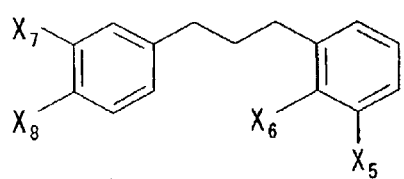
Figure 7C:
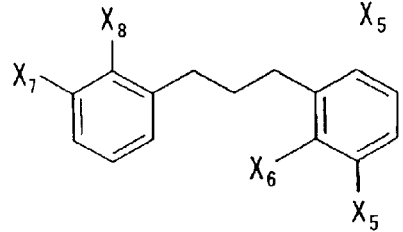
Figure 7D:
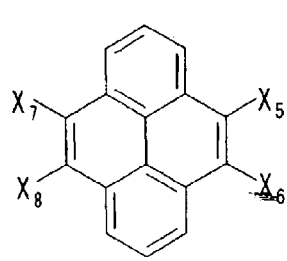
Figure 7D:
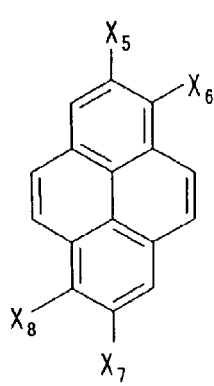
Figure 7D:
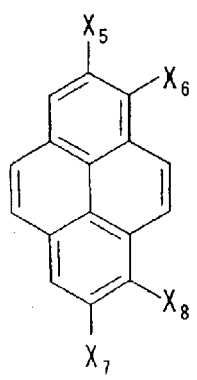
Figure 7D:
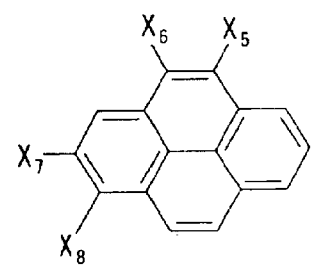
Figure 8A:
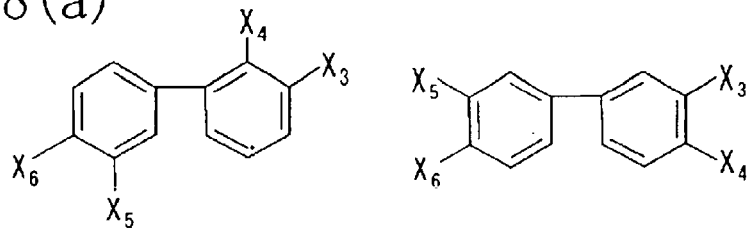
FIGS. 8(a) through 8(d) are diagrams of exemplified chemical formulas of the second monomer corresponding to a Lewis base.
Figure 8B:
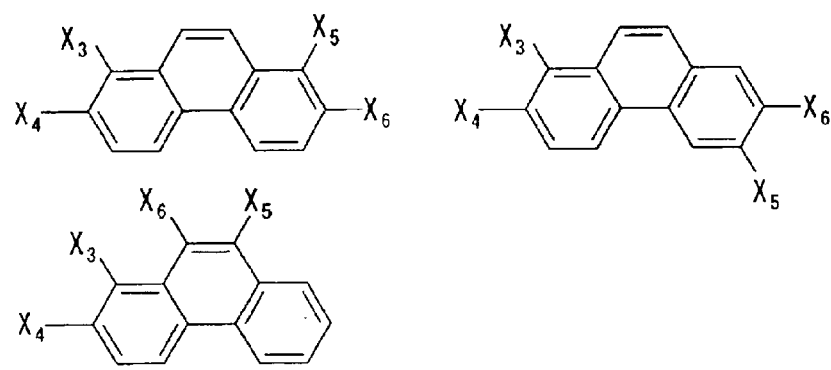
Figure 8C:
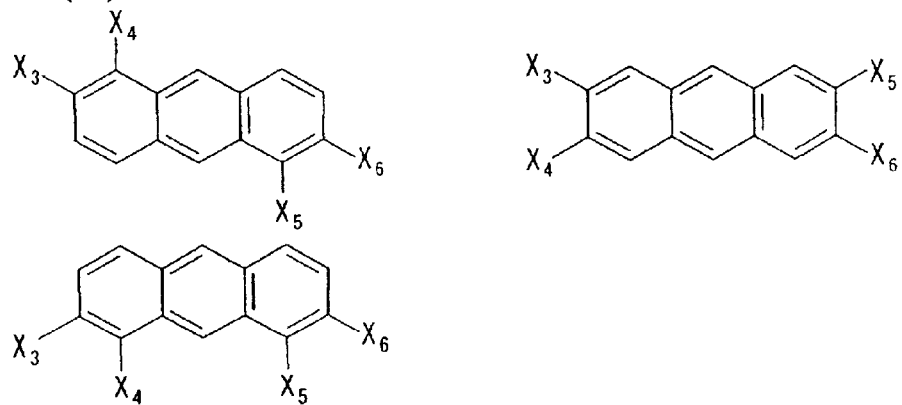
Figure 8D:
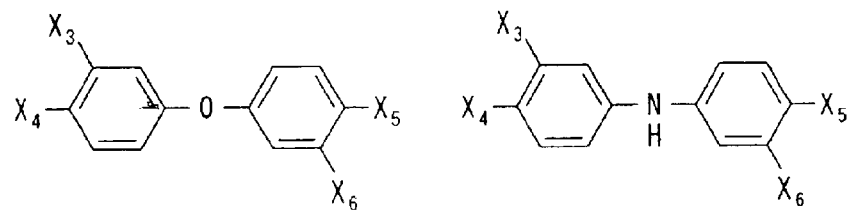
Figure 9A:
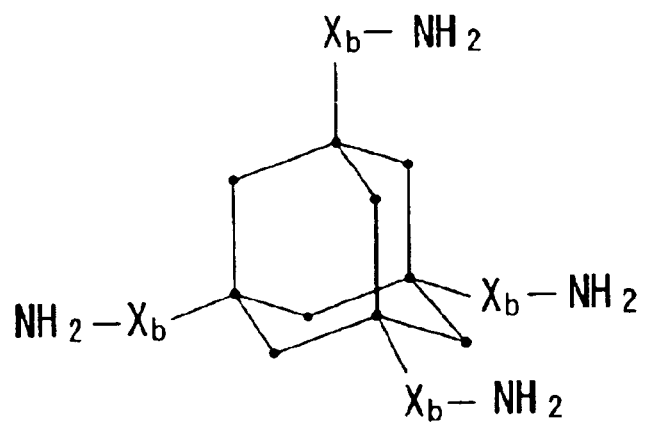
FIGS. 9(a) and 9(b) are diagrams of exemplified chemical formulas of the second monomer corresponding to a Lewis base.
Figure 9B:
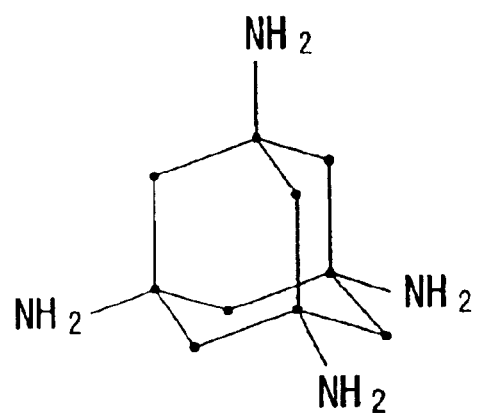
Figure 10A:
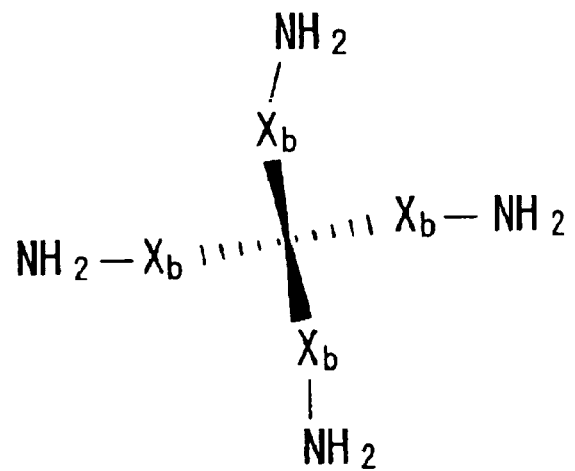
FIGS. 10(a) and 10(b) are diagrams of exemplified chemical formulas of the second monomer corresponding to a Lewis base.
Figure 10B:
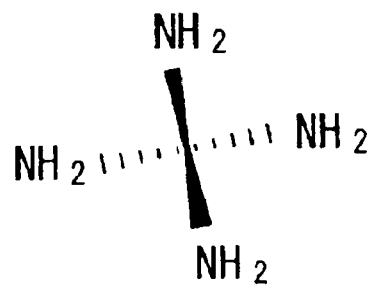

As the flexible monomer, for example, an adamantane derivative having a flexible bond in which Xa of FIG. 3(a) or 4(a) or Xb of FIG. 9(a) or 10(a) is a methylene group (—(CH$_2$)$_n$—) or an aromatic derivative monomer having a flexible bond formed by a methylene group (—(CH$_2$)$_n$—) as shown in FIGS. 5(c), 6(d), 7(c) and 8(d) can be used. Also, as the less crosslinked monomer, for example, an adamantane derivative having a substituent group number smaller than 4, such as a 1-, 1,3-, or 1,3,5-substituted adamantane derivative (namely, one obtained by reducing the substituent group number of the compound of FIG. 3 or 9), is used as a mixed system with a 1,3,5,7-substituted adamantane derivative. Alternatively, a mixed system of a 1-substituted, 2-substituted or 3-substituted methane derivative (namely, one obtained by reducing the substituent group number of the compound of FIG. 4 or 10) with a 4-substituted methane derivative can be used.

Furthermore, the mechanical strength can be improved as well as the adhesion can be improved by realizing a structure with a large number of branches and a high crosslink density (see FIG. 17).

What is claimed is:

1. A method for forming an interlayer insulating film comprising the steps of:

generating a monomer adduct in which a first monomer corresponding to a Lewis acid and a second monomer corresponding to a Lewis base are bonded to each other through weak electric interaction by causing a Lewis acid-base reaction between said first monomer and said second monomer in a solution;

forming a supramolecular solid thin film made of said monomer adduct by applying said solution including said monomer adduct on a substrate; and forming an interlayer insulating film by causing a polymerization reaction between said first monomer and said second monomer within said supramolecular solid thin film by heating said supramolecular solid thin film.

2. The method for forming an interlayer insulating film of claim 1, wherein said Lewis acid is a carboxylic acid derivative, an alcohol derivative, a ketone derivative, an aldehyde derivative or an acid anhydride derivative, and said Lewis base is an amine derivative.

3. The method for forming an interlayer insulating film of claim 1, wherein said Lewis acid is an adamantane derivative having a carboxyl group, and said Lewis base is a tetraaminobenzidine derivative having an amino group, a tetraaminobenzene derivative having an amino group or a diaminodihydroxylbenzene derivative having an amino group.

4. The method for forming an interlayer insulating film of claim 3, wherein said adamantane derivative having a carboxyl group is a 1-carboxyladamantane derivative, a 1,3-dicarboxyladamantane derivative, a 1,3,5-tricarboxyladamantane derivative, a 1,3,5,7-tetracarboxyladamantane derivative or a mixture of any of said derivatives.

5. The method for forming an interlayer insulating film of claim 1, wherein said Lewis acid is a benzene derivative having a carboxyl group, a benzidine derivative having a carboxyl group, a naphthalene derivative having a carboxyl group, an anthracene derivative having a carboxyl group or a tetracene derivative having a carboxyl group, and said Lewis base is an adamantane derivative having an amino group.

6. The method for forming an interlayer insulating film of claim 5, wherein said adamantane derivative having an amino group is a 1-aminoadamantane derivative, a 1,3-diaminoadamantane derivative, a 1,3,5-triaminoadamantane derivative, a 1,3,5,7-tetraamine derivative or a mixture of any of said derivatives.

7. The method for forming an interlayer insulating film of claim 1, wherein at least one of said first monomer and said second monomer has a flexible bond.

8. The method for forming an interlayer insulating film of claim 7, wherein said flexible bond is formed by a methylene group.

* * * * *

UNITED STATES PATENT AND TRADEMARK OFFICE
CERTIFICATE OF CORRECTION

PATENT NO. : 6,936,552 B2
DATED : August 30, 2005
INVENTOR(S) : Nobuo Aoi

It is certified that error appears in the above-identified patent and that said Letters Patent is hereby corrected as shown below:

<u>Title page,</u>
Item [56], References Cited, FOREIGN PATENT DOCUMENTS,
change "JP      2399454" to     -- FR      2399454 --;
change "JP      2004-617989" to -- JP      2004-517989 --.

Signed and Sealed this

Twenty-ninth Day of November, 2005

JON W. DUDAS
*Director of the United States Patent and Trademark Office*